(12) United States Patent
Dempsey

(10) Patent No.: US 12,166,496 B2
(45) Date of Patent: Dec. 10, 2024

(54) DIGITAL-TO-ANALOG CONVERTER GLITCH REDUCTION TECHNIQUES

(71) Applicant: Analog Devices International Unlimited Company, Limerick (IE)

(72) Inventor: Dennis A. Dempsey, Newport (IE)

(73) Assignee: Analog Devices International Unlimited Company, Limerick (IE)

( * ) Notice: Subject to any disclaimer, the term of this patent is extended or adjusted under 35 U.S.C. 154(b) by 170 days.

(21) Appl. No.: 18/069,853

(22) Filed: Dec. 21, 2022

(65) Prior Publication Data
US 2024/0213994 A1   Jun. 27, 2024

(51) Int. Cl.
| H03M 1/08 | (2006.01) |
| H03M 1/76 | (2006.01) |
| H03M 1/78 | (2006.01) |
| H03M 1/10 | (2006.01) |
| H03M 1/66 | (2006.01) |

(52) U.S. Cl.
CPC ......... *H03M 1/0872* (2013.01); *H03M 1/765* (2013.01); *H03M 1/785* (2013.01); *H03M 1/1014* (2013.01); *H03M 1/66* (2013.01)

(58) Field of Classification Search
CPC .... H03M 1/0872; H03M 1/765; H03M 1/785; H03M 1/66; H03M 1/1014
See application file for complete search history.

(56) References Cited

U.S. PATENT DOCUMENTS

| 5,969,657 | A | 10/1999 | Dempsey et al. |
| 6,304,199 | B1 | 10/2001 | Fang et al. |
| 6,320,527 | B1 | 11/2001 | Dedic et al. |
| 7,928,881 | B1 * | 4/2011 | Baek ................ H03M 1/682 |
| | | | 327/107 |
| 8,022,850 | B2 | 9/2011 | Newman |
| 8,284,089 | B2 | 10/2012 | Guedon |
| 8,378,870 | B1 | 2/2013 | Matsuura |
| 8,912,940 | B2 | 12/2014 | Dempsey |
| 8,922,416 | B2 | 12/2014 | Lin et al. |
| 9,407,278 | B1 | 8/2016 | Dempsey |

(Continued)

FOREIGN PATENT DOCUMENTS

| CN | 108183711 A | 6/2018 |
| CN | 111416621 A | 7/2020 |

(Continued)

OTHER PUBLICATIONS

"AD5724/AD5734/AD5754 Data Sheet", Analog Devices, Inc., (2017), 31 pgs.
"AD7836 Data Sheet", Analog Devices, Inc., (1999), 12 pgs.
"Application Note 7162: How to Perform Accurate Measurement and Reduction of Glitch Impulse Energy in DACS", Maxim Integrated Products, Inc., [Online] Retrieved from the Internet: <URL: https://www.maximintegrated.com/en/design/technical-documents/app-notes/7/7162.html>, [Retrieved on Sep. 6, 2022], (Nov. 26, 2019), 5 pgs.

(Continued)

*Primary Examiner* — Joseph J Lauture
(74) *Attorney, Agent, or Firm* — Schwegman Lundberg & Woessner, P.A.

(57) ABSTRACT

A digital technique to reduce or minimize switching in a DAC by using a partial DAC data ignore switching mode. In the partial DAC data ignore switching mode, a control circuit compares first and second data, such a first and second digital words, and operates corresponding switches only when the first data differ from the second data. The techniques are applicable to many types of DACs, including voltage output DACs, current output DACs, variable resistance DACs, digital rheostats, digital potentiometers, digiPOTs.

20 Claims, 9 Drawing Sheets

(56) References Cited

U.S. PATENT DOCUMENTS

| | | | |
|---|---|---|---|
| 10,050,640 B1 | 8/2018 | Bal et al. |
| 10,498,353 B2 | 12/2019 | Huang et al. |
| 10,522,107 B2 | 12/2019 | Park et al. |
| 10,673,449 B1 | 6/2020 | Yang et al. |
| 10,693,487 B1 | 6/2020 | Lei et al. |
| 2011/0156942 A1 | 6/2011 | Li |

FOREIGN PATENT DOCUMENTS

| | | |
|---|---|---|
| CN | 118232915 | 6/2024 |
| KR | 101520521 B1 | 5/2015 |
| WO | 2022184270 | 9/2022 |

OTHER PUBLICATIONS

"Introducing the nanDAC+ Family", Analog Devices, Inc., (2013), 2 pgs.

Kester, Walt, "Analog-Digital Conversion", Analog Devices, Inc., (2004), 1138 pgs.

Kester, Walt, "MT-013 Tutorial", Analog Devices, Inc., (2009), 16 pgs.

Mercer, Douglas A, "Current Steering Digital-to-Analog Converters", Analog Devices, Inc., [Online] Retrieved from the Internet: <URL: https://wiki.analog.com/university/courses/tutorials/cmos-dac-chapter>, [Retrieved on Sep. 6, 2022], (Jan. 21, 2021), 30 pgs.

"European Application Serial No. 23208146.3, Extended European Search Report mailed Apr. 26, 2024", 13 pgs.

\* cited by examiner

DIGITAL-TO-ANALOG CONVERTER GLITCH REDUCTION TECHNIQUES

FIELD OF THE DISCLOSURE

This document pertains generally, but not by way of limitation, to digital-to-analog converters (DACs).

BACKGROUND

Real-world analog signals such as temperature, pressure, sound, or images are routinely converted to a digital representation that can be easily processed in modern digital systems. In many systems, this digital information is converted back to an analog form to perform some real-world function. The circuits that perform this step are digital-to-analog converters (DACs), and their outputs are used to drive a variety of devices. Loudspeakers, video displays, motors, mechanical servos, sensors, level setting or biasing, communications, instrumentation, radio frequency (RF) transmitters, temperature controls are just a few diverse examples. DACs are often incorporated into digital systems in which real-world signals are digitized by analog-to-digital converters (ADCs), processed, and then converted back to analog form by DACs.

A DAC produces a quantized or discrete step analog output signal in response to a binary digital input code and the analog output is commonly a voltage or a current. To generate the output signal, a reference quantity, or level, (usually the aforementioned voltage or current) is divided into binary and/or linear fractions. Then the digital input drives switches that combine an appropriate number of these fractions to produce the output signal. The number and size of the fractions reflect the number of possible digital input codes, which is a function of converter resolution or the number of bits (N) in the input code. For n bits, there are $2^N$ possible codes. The analog output signal of the DAC output is the digital fraction represented as the ratio of the digital input code divided by $2^N$ (or $2^N-1$ depending on the specific definition used) times the analog reference value.

SUMMARY OF THE DISCLOSURE

This disclosure describes, among other things, a digital technique to reduce or minimize switching in a DAC by using a partial DAC data ignore switching mode. In the partial DAC data ignore switching mode, a control circuit compares first and second data, such a first and second digital words, and operates corresponding switches only when the first data differ from the second data. The techniques of this disclosure are applicable to many types of DACs, including voltage output DACs, current output DACs, variable resistance DACs, digital rheostats, digital potentiometers, digiPOTs.

In some aspects, this disclosure is directed to a digital-to-analog converter (DAC) system to convert a digital input signal to an output level of an analog output signal, the DAC system comprising: a plurality of analog switches; a digital DAC register; a DAC circuit coupled to the digital DAC register and configured to generate the analog output signal; and a control circuit coupled to the plurality of analog switches and the digital DAC register, wherein the control circuit includes a partial DAC data ignore switching mode, and wherein the control circuit is configured to perform operations including: receiving first data from the digital DAC register, wherein the first data represents a first digital input signal; and receiving second data coupled to an input of the digital DAC register, wherein the second data represents a second digital input signal received after the first digital input signal; wherein, in the partial DAC data ignore switching mode, the control circuit is configured to perform operations including: comparing the first data and the second data; and operating corresponding ones of the plurality of analog switches only when DAC decoded states of the first data differ from DAC decoded states of the second data.

In some aspects, this disclosure is directed to a method of operating a digital-to-analog converter (DAC) system to convert a digital input signal to an output level of an analog voltage output signal, the method comprising: receiving first data from a digital DAC register, wherein the first data represents a first digital input signal; and receiving second data coupled to an input of the digital DAC register, wherein the second data represents a second digital input signal received after the first digital input signal; in a partial DAC data ignore switching mode: comparing the first data and the second data; and operating individual ones of a plurality of analog switches only when DAC decoded states of the first data differs from DAC decoded states of the second data.

In some aspects, this disclosure is directed to a digital-to-analog converter (DAC) system to convert a digital input signal to an output level of an analog output signal, the DAC system comprising: a plurality of analog switches; a digital DAC register; a DAC circuit coupled to the digital DAC register and configured to generate the analog output signal; and a control circuit coupled to the plurality of analog switches and the digital DAC register, wherein the control circuit includes a partial DAC data ignore switching mode and a normal switching mode, and wherein the control circuit is configured to perform operations including: receiving first data from the digital DAC register, wherein the first data represents a first digital input signal; and receiving second data coupled to an input of the digital DAC register, wherein the second data represents a second digital input signal received after the first digital input signal; wherein, in the partial DAC data ignore switching mode, the control circuit is configured to perform operations including: comparing the first data and the second data; and operating individual ones of the plurality of analog switches only when DAC decoded states of the first data differ from DAC decoded states of the second data; and wherein, in the normal switching mode, the control circuit is configured to perform operations including: overriding the partial DAC data ignore switching mode; and operating individual ones of the plurality of analog switches even when the first data does not differ from the second data.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
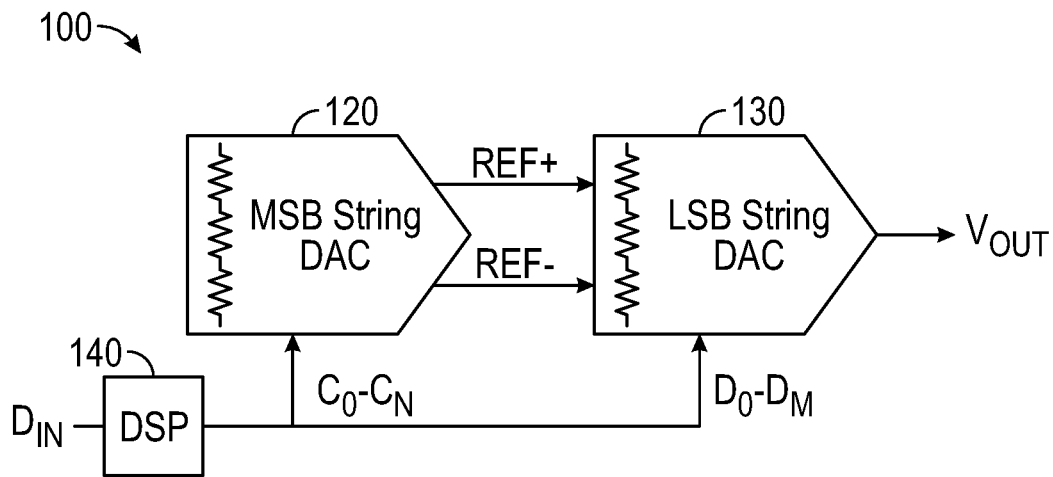
FIG. 1 shows a simplified block diagram of a dual string DAC.

All digital-to-analog converters (DACs) exhibit a glitch impulse at the analog output when the DAC digital code input changes either from low-to-high or high-to-low. This phenomenon is commonly most pronounced during a major carry code transition at midscale, which can create undesirable performance. When the DAC output analog value changes, a dynamic phenomenon is observed at the DAC output in the form of a glitch. Glitch energy is defined as the area under the curve on a voltage vs. the time plot (as captured on a scope). The unit of glitch energy is V/s, with specifications often using nV×s.

A glitch is generated due to the mismatched propagation delays among internal switches in selecting the resistors when the digital bits are changed and is most noticeable when the input code changes at midscale. For example, at midscale all the bits including the most significant bit (MSB) are changed with only 1 least significant bit (LSB) change, creating a major carry transition because all the internal switches are either open or closed simultaneously. Hence, the worst glitch is usually generated at this midscale transition. The worst case LSB transition for glitch energy is DAC architecture, and detailed design implementation dependent.

There are multiple forms or variants of DAC glitching, dependent on DAC operation. In addition, DAC glitch performance is highly architecture and design dependent. Lower speed DACs are often optimized for small glitch magnitude (often measured in peak-peak), but this can result in higher glitch energy due to lower settling speed/bandwidth. Higher speed DACs commonly have larger magnitude glitches and smaller energy due to high-speed setting and this is preferrable in an AC-focused application because lower energy desirably results in smaller, or lower, signal distortion. For most DACs of reasonable resolution, glitch performance is also generally code dependent, as well as depending upon process, temperature, and voltage (PVT) due to non-identical architecture artefacts.

For those skilled in the art, the DAC circuitry is conventionally designed so that during DAC transitions that the switches of the voltage-based networks, e.g. resistor DAC networks do not erroneously have transient short circuits, or that current-mode circuitry does not go into intermediate high impedance state, as these would case un-desirable glitching and longer settling times. Break-before-make (BBM) drive is conventional for voltage networks and make-before-break (MBB) designs are used for current-mode DAC circuits to ensure the transitions are controlled and as desired. For an N-bit DAC, there are approximately $22^{N-1}$ combinations of code changes, and hence it is convention to control the DAC switches during code changes to avoid un-wanted glitches in all cases.

The present inventor has recognized a need for reducing or minimizing switching in a DAC to reduce power consumption, glitching, and/or crosstalk. The solution is to reduce all forms of crosstalk including digital to analog crosstalk, DAC to DAC crosstalk or from the DAC to other co-integrated circuitry. The present inventor has further recognized that, for each DAC stage, if there is no switching in a given DAC stage then it can be advantageous not to change the switch states or change the switch drivers to minimize analog-mixed signal (AMS) activity, glitching, power, and digital activity. Rather than simply transitioning from one code to another with one sequence for all cases, it can be desirable to reduce or minimize updates to the DAC switching because it is likely that not all of the switches in the DAC need to be switched and any unneeded switching can negatively impact DAC glitch performance. Further, with CMOS integration of digital processing closer to, or within, the sensing and/or actuating device using more leading wafer fabrication processes to add value at the edge, there is a key opportunity to develop new edge processing solutions to leverage the wafer fabrication capability further, which has also provided motivation for the ideas of this disclosure.

This disclosure describes, among other things, a digital technique to reduce or minimize switching in a DAC by using a partial DAC data ignore switching mode. In the partial DAC data ignore switching mode, a control circuit compares first and second data, such a first and second digital words, and operates corresponding switches only when the first data differ from the second data. The techniques of this disclosure are applicable to many types of DACs, including voltage output DACs, current output DACs, variable resistance DACs, digital rheostats, digital potentiometers, digiPOTs.

FIG. 1 shows a simplified block diagram of a dual string DAC 100. The dual string DAC 100 includes a most significant bits (MSB) String DAC 120 and a least significant bits (LSB) String DAC 130, which both include series-coupled impedance strings, such as resistor strings. A digital signal processor (DSP) 140 receives a digital input signal Din and outputs control signals $C_0$-$C_N$ to control the MSB String DAC 120 and control signals $D_0$-$D_M$ to control the LSB String DAC 130. The MSB String DAC 120 typically converts the most significant bits (MSBs) of the digital word, and its output is coupled to the LSB String DAC 130, which converts the least significant bits (LSBs) of the digital word. The MSB String DAC 120 represents a first sub-block (or sub-DAC) of the dual string DAC 100 and the LSB String DAC 130 represents a second sub-block (or sub-DAC) of the dual string DAC 100. VOUT represents the converted analog signal.

Figure 2:
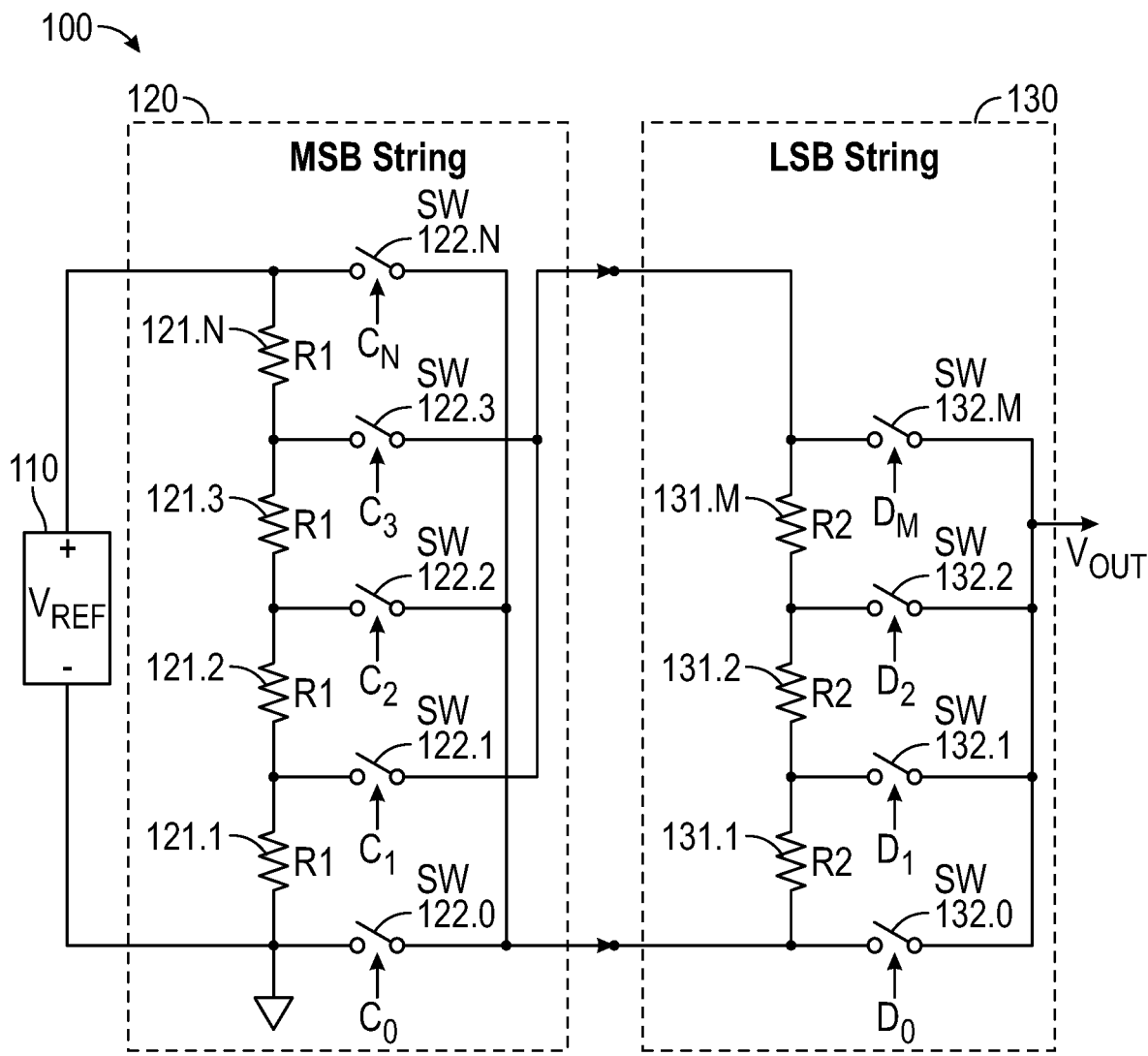
FIG. 2 depicts an example of a schematic diagram of the dual string digital-to-analog converter of FIG. 1.

FIG. 2 depicts an example of a schematic diagram of the dual string digital-to-analog converter 100 of FIG. 1. As shown, each string 120, 130 include a resistor string 121.1-121.N, 131.1-131.M coupled to respective analog switches (SW) 122.0-122.N, 132.0-132.M that are operated according to digital word-based control signals, $C_0$-$C_N$ and $D_0$-$D_M$.

Also, the analog switches 122.0-122.N, 132.0-132.M generally include only two states—on or off.

It will be appreciated that resistors are an example of a type of impedance element that can be used, and it is not intended to limit the present teaching to an implementation where resistors are used exclusively as impedance elements. In this regard it will be appreciated that resistors may be a preferred type of impedance element, particularly in scenarios where the voltage across the string is high—such as the string that is coupled to the reference terminals of the converter. In other strings where the voltage is relatively small, other elements such as active MOS devices may also be used. The present teaching should therefore not be construed as being limited to a multi-resistor string DAC.

The techniques of this disclosure can be used with various analog switches, such as, but not limited to field-effect transistors (FETs), planar complementary metal-oxide semiconductor (CMOS) devices, double diffusion metal oxide semiconductor field-effect transistor (DMOS) variants, Hi-K metal gate (HKMG) devices, finFETs, gate all around (GAA) FETs, as well as microelectromechanical systems (MEMS) switches and nanoelectromechanical systems (NEMS) switches.

Figure 3:
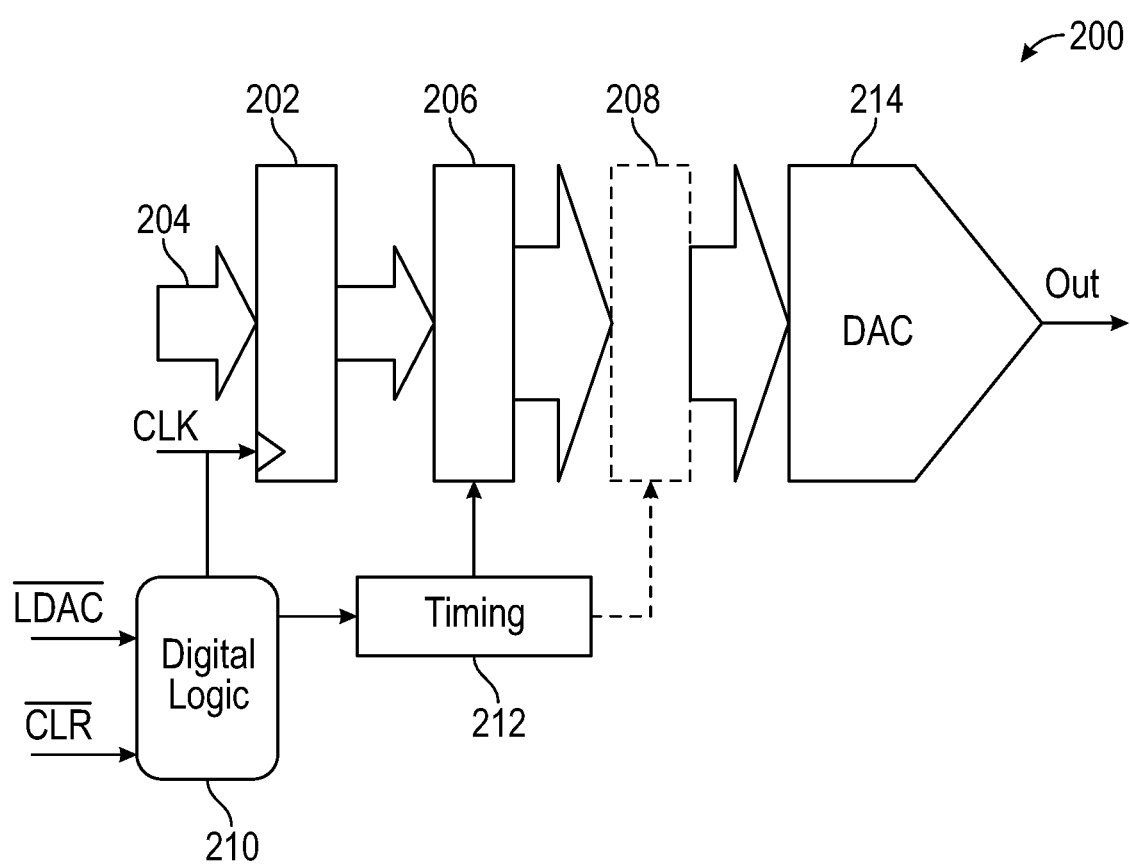
FIG. 3 is an example of a DAC system.

FIG. 3 is an example of a DAC system 200. The DAC system 200 includes a digital DAC register 202 that can receive digital input data 204 for conversion to an analog output signal "OUT". The digital DAC register 202 can be implemented using latches or flip-flops, for example. A DAC decode logic circuit 206 is coupled to an output of the digital DAC register 202. In some examples, rather than applying the digital input data 204 directly to the digital DAC register 202, the DAC system 200 can include the digital DAC input register. An optional DAC switch driver circuit 208 is coupled to an output of the DAC decode logic circuit 206 and can be used to optimize performance. In some examples, the optional DAC switch driver circuit 208 can be merged with the DAC decode logic circuit 206.

A digital logic circuit 210 loads the digital input data 204 into the digital DAC register 202 in response to a "load DAC" (LDAC_bar) signal, e.g., an active low pin. A clear (CLR) signal can clear, or reset, the DAC to a known state. The clear signal can be an active low CLR pin (CLR_bar). The digital logic circuit 210 can be a digital interface or a sub-part of digital control or a state machine. The digital logic circuit 210 provides a load signal to the digital DAC register 202 as well as an optional timing circuit 212. The optional timing circuit 212 provides timing signals to the DAC decode logic circuit 206 and the DAC switch driver circuit 208. The optional timing circuit 212 can be used to provide timing for make-before-break or break-before-make switching solutions, for example, as appropriate. The output of the DAC decode logic circuit 206 (or the output of the separate, optional DAC switch driver circuit 208, if present), is applied to a DAC circuit 214 configured to generate the analog output signal "OUT". The DAC circuit 214 contains the analog mixed signal (AMS) DAC core and can contain DAC-specific control circuitry and/or an additional DAC buffer circuitry to buffer from the DAC core to the output. In some implementations, the AMS DAC core contains all the switches of the DAC, such as those shown in FIG. 2.

Assume that all of the MSB and LSB switches in FIG. 2 are set in a first configuration that represents first digital input data 204 that was loaded by the digital logic circuit 210 and decoded by the DAC decode logic circuit 206. Next, assume that the digital logic circuit 210 loads second digital input data 204 that is the same as the first digital input data 204. Resetting all of the switches in FIG. 2 and performing a decode on the second digital input data 204 would unnecessarily consume power and increase glitching because no changes to the switches were needed because there were changes to the data.

Next, instead of the second digital input data 204 being the same as the first digital input data 204, assume that the second digital input data 204 differs from the first second digital input data 204 by one or several bits, for example. In such an example, it is likely that not all of the switches in the DAC need to be switched. For example, if one or more LSB bits changed but no MSB bits changed, the DAC system 200 would not need to operate the MSB switches 122.0-122.N in FIG. 2, thereby saving power and reducing glitching. To solve this problem, the present inventor has recognized that a DAC core can implement a partial DAC data ignore switching mode in which a control circuit compares first and second data and operates corresponding switches only when the first data differs from the second data. In some examples, the techniques can perform a full word comparison. In addition to full word comparison, the inventor has recognized that, using the DAC core knowledge, that there is also opportunity to better analyze the change to minimize changes when the DAC has multiple switching networks.

Figure 4A:
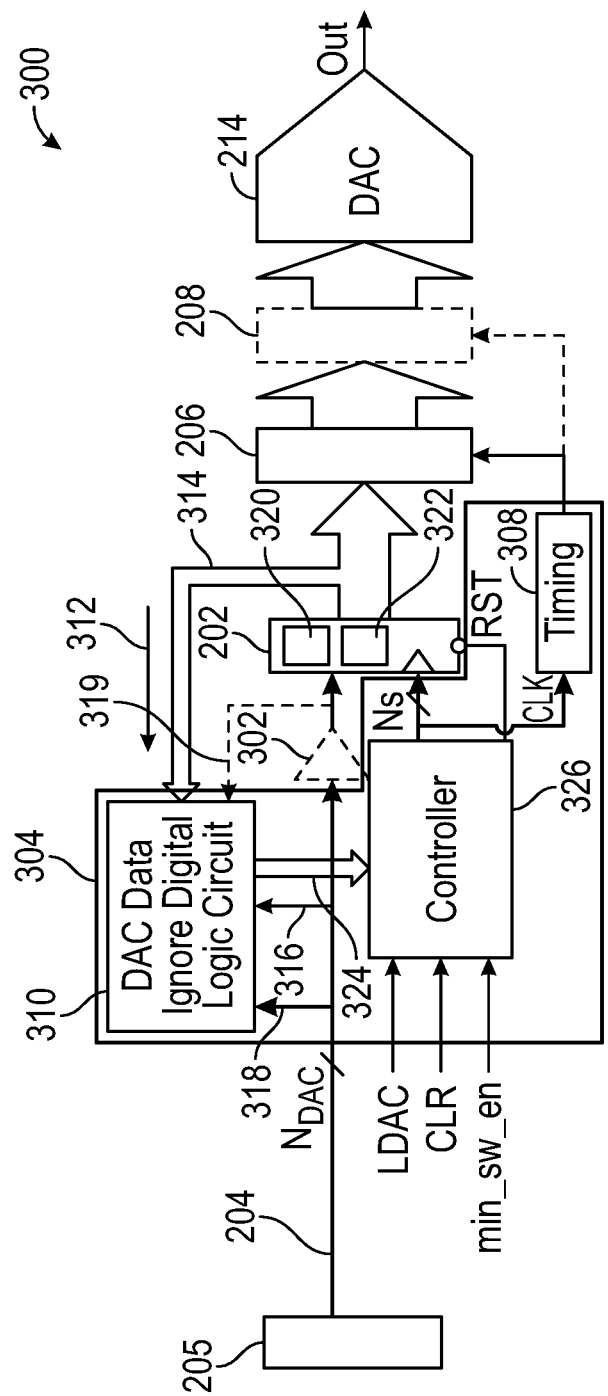
FIG. 4A is an example of a DAC system to convert a digital input signal to an output level of an analog output signal that can implement various techniques of this disclosure.

FIG. 4A is an example of a DAC system 300 to convert a digital input signal to an output level of an analog output signal that can implement various techniques of this disclosure. The DAC system 300 includes a digital DAC register 202 that can receive digital input data 204, such as a DAC word, for conversion to an analog output signal "OUT". The DAC decode logic circuit 206 is coupled to an output of the digital DAC register 202. The DAC decode logic circuit 206 drives the DAC switches in the DAC circuit 214. Optionally, a DAC switch driver circuit 208 is coupled to an output of the DAC decode logic circuit 206 and can be used to optimize performance. In some examples, the optional DAC switch driver circuit 208 can be merged with the DAC decode logic circuit 206. An example of the DAC circuit 214 is shown in FIG. 2, including a plurality of analog switches that switch in resistive elements to decode the digital input data 204.

A digital logic circuit loads the digital input data 204 into the digital DAC register 202, such as described above with respect to the digital logic circuit 210 of FIG. 3, via a bus $N_{DAC}$ bits wide, where $N_{DAC}$ is the resolution of the DAC system 300. It should be noted that digital input data 204 refers to data that is input into an input register (when present), such as the input register 205 of FIG. 4A, as well as data that is input into a digital DAC register 202 in configurations that do not include an input register, such as in FIG. 3.

In some examples, an input register 205 can be included. An output of the input register 205, e.g., latches, flip-flops or random access memory (RAM), is coupled to the input of the digital DAC register 202 and the digital logic circuit loads the digital input data 204 from the input register 205 into the digital DAC register 202.

In some examples, an optional buffering circuit 302 can be coupled to the digital DAC register 202 to buffer the digital input data 204. The optional buffering circuit 302 can provide a data path buffer to balance the timing, if needed.

The DAC system 300 includes a control circuit 304 that includes a controller 326 and a timing circuit 308. The control circuit 304 further includes a partial DAC data ignore switching mode implemented using a DAC data ignore digital logic circuit 310. The data can include bytes, words, long words, and the like, for example.

In the partial DAC data ignore switching mode, the control circuit 304 and, in particular, the DAC data ignore digital logic circuit 310 is configured to receive first data 312 via a bus 314 from the digital DAC register 202, where the first data 312 represents a first digital input signal ($D_{IN}$ of FIG. 1), and receive second data 316 via bus 318 coupled to the input of the digital DAC register 202 or via bus 319, where the second data represents a second digital input signal ($D_{IN}$ of FIG. 1) received after the first digital input signal ($D_{IN}$ of FIG. 1). The second data 316 is detectable at the input of the digital DAC register 202, which can correspond to the output of an input register or some other bus input.

In the partial DAC data ignore switching mode, the control circuit 304 and, in particular, the DAC data ignore digital logic circuit 310 is configured to compare the first data 312 and the second data 316 and operate corresponding ones of the plurality of analog switches only when DAC decoded states of the first data differ from DAC decoded states of the second data. For example, the DAC data ignore digital logic circuit 310 can OR together, e.g., using exclusive OR (XOR) logic, the first data 312 and the second data 316 to determine whether the second data 316 is updated.

By way of a non-limiting examples for the purposes of explanation, the first data 312 and the second data 316 can be 12-bits each. The digital DAC register 202 can include a first digital DAC register 320, such as a 6-bit DAC digital DAC register, and a second digital DAC register 322, such as a 6-bit DAC digital DAC register, where the first digital DAC register receives and stores the MSBs and the second digital DAC register receives and stores the LSBs. The first digital DAC register 320 and the second digital DAC register 322 store the MSBs and LSBs, respectively of first data 312.

The DAC system 300 receives the second data 316, which is sent via the bus 318 to the DAC data ignore digital logic circuit 310. The DAC data ignore digital logic circuit 310 performs an exclusive OR, for example, to compare the MSBs of the second data 316 with the MSBs of the first data 312 stored in the first register 320 of the digital DAC register 202 and determine which MSB bits, if any, have changed. The DAC data ignore digital logic circuit 310 then performs an exclusive OR, for example, to compare the LSBs of the second data 316 with the LSBs of the first data 312 stored in the second register 322 of the digital DAC register 202 and determine which LSB bits, if any, have changed. It should be noted that for multi-stage DACs where the updates are mostly small in magnitude, a first DAC sub-block or MSB DAC may not need to change often and these techniques provide an opportunity to reduce unnecessary DAC sub-block changes in such applications with improved performance.

The digital comparison can also check architecture specific artefacts, whilst considering the input coding format, to check DAC sub-blocks separately. Such DAC architecture specific DAC data change cases can be identified during the development process and captured in the signal analysis for DAC 100 of FIG. 2. Such a special case exists where the same LSB DAC switch is used at each MSB-LSB DAC code transition. Hence, when the LSB DAC codes, only, all change from zeroes to fullscale or visa-versa, no change is required to the LSB DAC switching. Such architecture and design specific cases can be checked to maximize this "minimum switching" technique, with the purpose of reducing or minimizing DAC switching.

In this manner, the DAC system 300 can determine, using the digital input data, which of the sub-DACs change, e.g., the MSB String DAC 120 of FIG. 1 and/or the LSB String DAC 130 of FIG. 1, which can allow for sub-DAC specific switching. For example, in the dual string DAC 100 of FIG. 1, if there are only changes to the switches of the LSB String DAC 130, there may not be any changes to the switches in the MSB String DAC 120. As such, the DAC system 300 does not need to change the state of any of the switches in the MSB String DAC 120, thereby reducing or minimizing DAC switching. Reducing or minimizing DAC switching reduces power consumption, glitching, and DAC-DAC crosstalk. Conversely, if the data analysis determines there are only changes to the switches of the MSB DAC 120, the DAC system 300 does not need to change the state of any switches n the LSB DAC string 130.

A clock signal CLK, such as when there is new data available, can be generated by the controller 326, which can apply clock signals to the digital DAC register 202 via a bus Ns bits wide, where Ns is the number of DAC sub-blocks (or the number of sub-DACs) or sub-functions. The controller 326 can also generate and supply clock signals to the timing circuit 308, which supplies the timing for the DAC decode logic circuit 206 and the optional DAC switch driver circuit 208. The timing circuit 308 can be used to provide timing for make-before-break or break-before-make switching solutions, for example.

The controller 326 can be used to selectively clock the separate registers of the digital DAC register 202, such as the first digital DAC register 320 and the second digital DAC register 322, when there have been updates to the data. After comparing the first data first data 312 and the second data 316 and determining the particular changes, the DAC data ignore digital logic circuit 310 can communicate the changes to the clock gating circuit 306 via the bus 324.

In some examples, the control circuit 304 includes a system level DAC data ignore switching mode implemented using the DAC data ignore digital logic circuit 310. In the system level DAC data ignore switching mode, the DAC data ignore digital logic circuit 310 checks and effectively ignores a new DAC word if the data is the same as the previous data word that is stored in the input register 205. In the system level DAC data ignore switching mode, the control circuit 304 and, in particular, the DAC data ignore digital logic circuit 310, receives the first data from the input register 205 via the bus 318 and receives the second data from the input register 205 via the bus 318. The DAC data ignore digital logic circuit 310 compares the first data and the second data and updates the digital DAC register 202 only when there is a difference between the first data and the second data. If the DAC data ignore digital logic circuit 310 compares the first data and the second data and determines that there is no difference between the first data and the second data, then the control circuit 304 ignores a request to update the digital DAC register 202.

In some examples, the control circuit 304 includes a register level DAC data ignore switching mode implemented using the DAC data ignore digital logic circuit 310. In the register level DAC data ignore switching mode, if the input register 205 has not been updated with a new word, any new "load DAC" request signals (LDAC) are ignored because the digital DAC register 202 is already up to date, which can avoid un-necessary glitching, crosstalk and dynamic power consumption. For example, the DAC data ignore digital logic circuit 310 ignores a load DAC request signal when the input register 205 has not been updated between two consecutive updates. In an example of an implementation, one latch per channel is loaded when new data is loaded into input register 205, such as with the input tied high. Then, the latch is reset/cleared when the data in the input register 205 data is transferred to the digital DAC register 202 (only once).

As seen in FIG. 4A, in some examples, the controller 326 receives an optional "minimum switching enabled" signal (MIN_SW_EN) to enable or disable the "minimum switching" technique described above. For example, the MIN_SW_EN signal can enable the minimum switching technique, such as in response to a user setting and can define how or if information is to be used when a DAC is updated.

With the "minimum switching" technique enabled, switching is required when the selected switch for a sub-block, e.g., the MSB String DAC 120 or the LSB String DAC 130 of FIG. 1, has changed. Also, for the entire DAC, if there has been no data change, then there is no switching. It may be desirable to disable such intelligent switch functionality, such as to reduce signal dependency to reduce signal distortion.

When the "minimum switching" mode is disabled, the DAC system 300 is in a "normal switching" mode. In the normal switching mode, the control circuit 304 is configured to override the partial DAC data ignore switching mode and operate corresponding ones of the plurality of analog switches even when the first data does not differ from the second data. To avoid un-controlled interim states during a DAC code transition that can result in high, un-controlled glitch impulse energy, the "normal switching" mode implemented by the control circuit 304 can use break-before-make (BBM) and/or make-before-break (MBB) (as appropriate for a given design) when swapping from a first DAC code to a second, new DAC code.

It should be noted that in other examples, rather than use a MIN_SW_EN signal to enable minimum switching, the "minimum switching" technique can always be enabled on the DAC system 300.

In some examples, the DAC system 300 can perform, using at least some of the plurality of analog switches, e.g., shown in FIG. 2, code-dependent switching to reduce statically encoded switching when the first data differs from the second data. That is, the DAC data ignore digital logic circuit 310 can compare new DAC data against previous DAC data and perform code-dependent DAC circuitry switching to reduce DAC circuitry switching.

In some examples, the controller 326 can generate and apply a reset signal "RST" to the digital DAC register 202. In some examples, the reset signal can reset the digital DAC register 202 to a hard-coded value. For example, each register bit can be reset to zero to reset the DAC register to zeroscale. In another example, the MSB bit can be set to one and other bits set to zero to reset the input register 205 to midscale. The digital DAC register 202 can be reset to have the same value of as the input register 205.

Figure 4B:
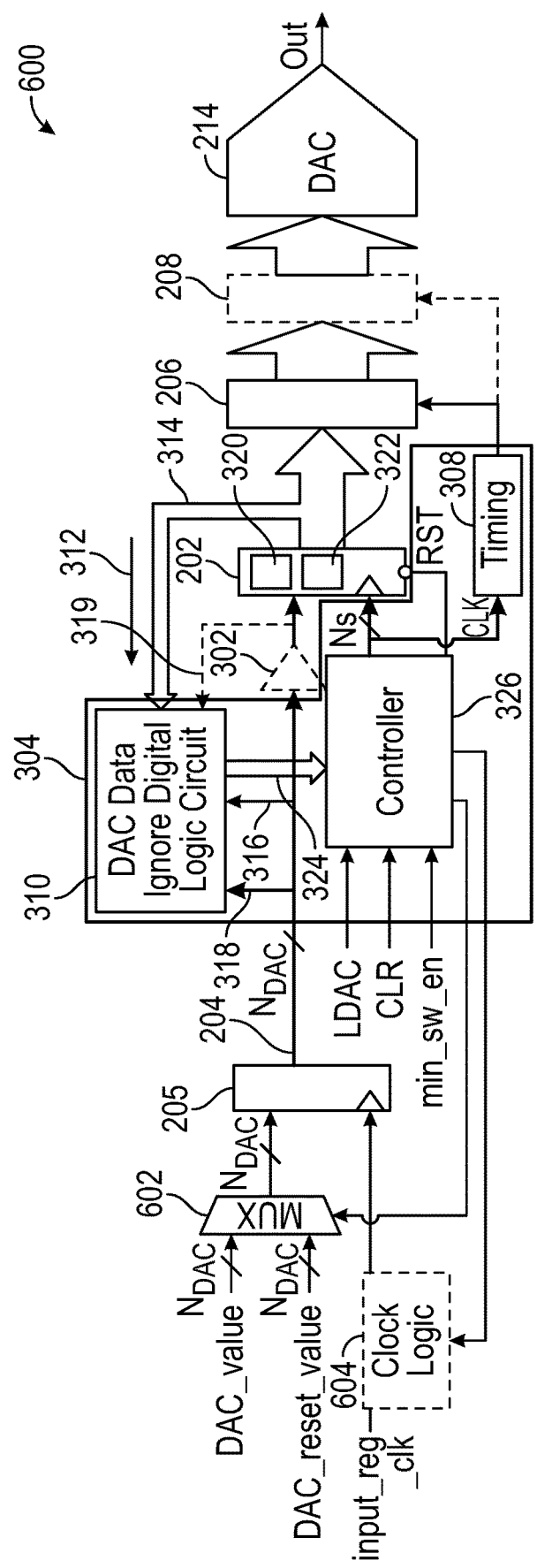
FIG. 4B is another example of a DAC system to convert a digital input signal to an output level of an analog output signal that can implement various techniques of this disclosure.

FIG. 4B is another example of a DAC system 600 to convert a digital input signal to an output level of an analog output signal that can implement various techniques of this disclosure. Many of the components of the DAC system 600 are similar to the components of the DAC system 300 of FIG. 4A and, as such, use similar reference numbers. For purposes of conciseness, similar components will not be described in detail again.

The DAC system 600 includes a multiplexer 602 coupled to an input of the input register 205 and controlled by a select signal from the controller 326. The optional DAC system 600 also includes a clock logic circuit 604 coupled to receive a signal from the controller 326 and provide a clock signal to the input register 205. Whilst the "INPUT_REG_CLK" clock input of input register 205 may have system functionality such that the appropriate clocking is provided elsewhere in the system the optional clock logic block 604 may be preferred so that the DAC block, which may be a hard IP, takes cares of these DAC specific LDAC and CLR control signals to ease design integration and verification.

The multiplexer 602 is configured to receive the data ("DAC_value") and a DAC reset value ("DAC_reset_value") and the controller 326 selects which of these to provide to the input register 205. In this manner, a user can provide a specific reset value, such as stored in another register.

If the controller 326 selects the DAC reset value ("DAC_reset_value"), the input register 205 can be clocked by a signal from the clock logic circuit 604. This allows the input register 205 and the digital DAC register 202 to be the same.

Figure 5A:
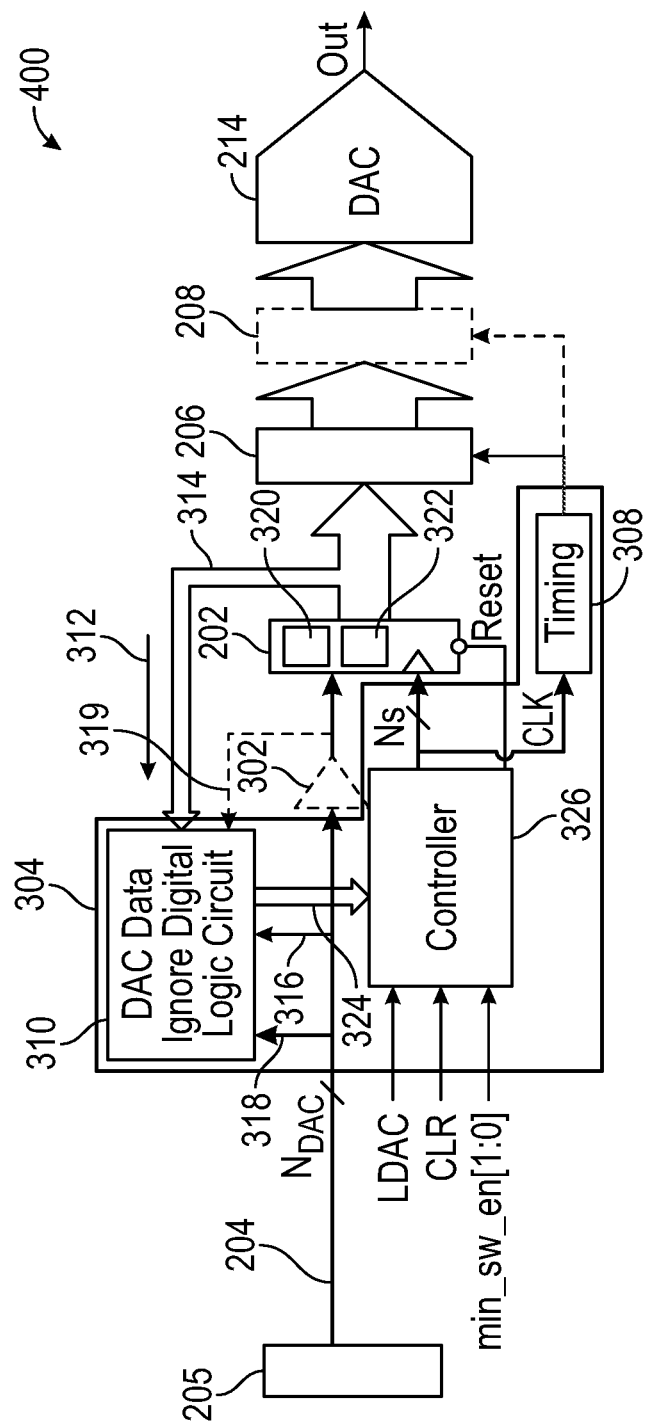
FIG. 5A is another example of a DAC system to convert a digital input signal to an output level of an analog output signal that can implement various techniques of this disclosure.

FIG. 5A is another example of a DAC system 400 to convert a digital input signal to an output level of an analog output signal that can implement various techniques of this disclosure. Many of the components of the DAC system 400 are similar to the components of the DAC system 300 of FIG. 4A and, as such, use similar reference numbers. For purposes of conciseness, similar components will not be described in detail again. In addition, the DAC system 400 is configured to implement one or more of a partial DAC data ignore switching mode, a system level DAC data ignore switching mode, and a register level DAC data ignore switching mode, like the DAC system 300 of FIG. 4.

In FIG. 5A, a 2-bit "minimum switching enabled" signal (MIN_SW_EN[1:0]) is depicted. Unlike the DAC system 300 of FIG. 4A, the DAC system 400 of FIG. 5A includes four modes that can be enabled using the MIN_SW_EN[1:0] signal: a normal switching mode (e.g., 00), a pseudo-random switching mode (e.g., 01), a noise-shaped switching mode (e.g., 10), and a minimum switching mode (e.g., 11). The normal switching mode and the minimum switching mode were described above with respect to FIG. 4A.

Figure 8:
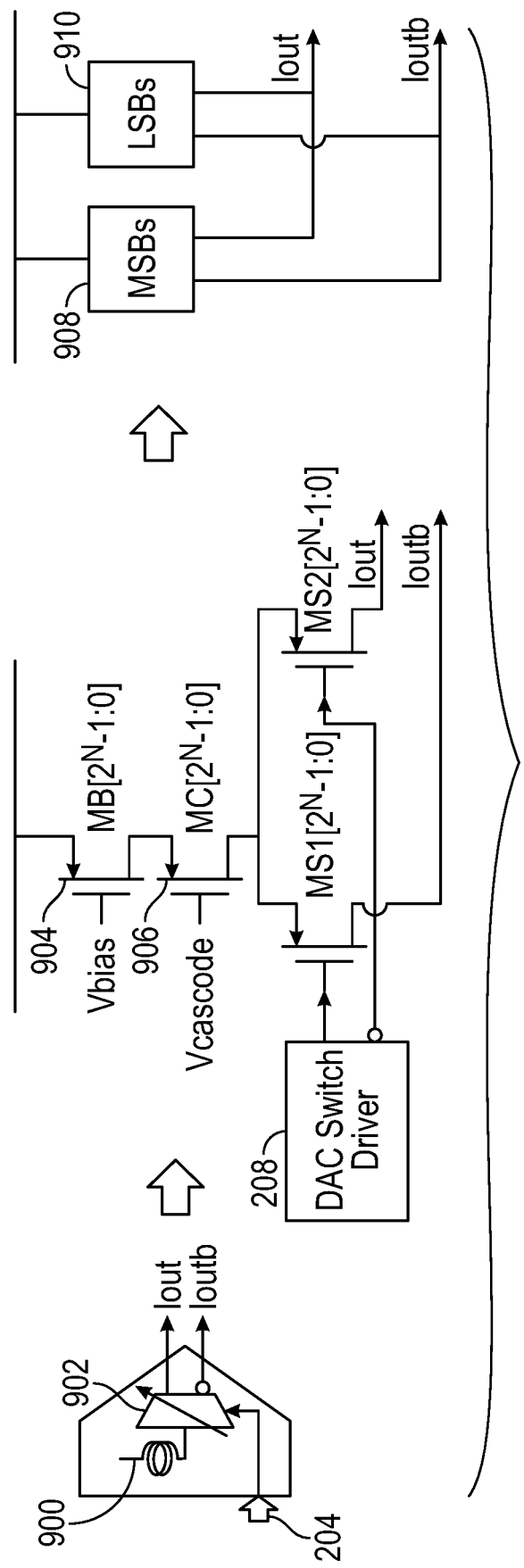
FIG. 8 is an example of a switched current DAC, or IDAC, circuit suitable for use with a pseudo-random number generator.

In the pseudo-random switching mode, the DAC data ignore digital logic circuit 310 can include a pseudo-random number generator or pseudo-random bit sequencer (PBRS), for example, to pseudo-randomly select the analog switches, such as switches in a parallel current output architecture. An example of a pseudo-random number generator is shown in FIG. 8 and described below.

In the noise-shaped switching mode, wherein, in the noise-shaped switching mode, the control circuit 304 can override the partial DAC data ignore switching mode (that is, the minimum switching mode), and operates corresponding ones of the plurality of analog switches, such as the switches in FIG. 2, so as to perform a dynamic element matching technique. Dynamic element matching (DEM) techniques include pseudo-random element selection and noise-shaping element selection. In random element selection, any mismatch goes from causing a signal dependent distortion to white noise, thereby raising the noise floor. With noise-shaping, mismatch-shaping causes more high frequency noise and less low frequency noise, which can be desirable for low bandwidth implementations like audio. Rotated element selection (RES), also known as barrel shifting, is an example of a DEM technique.

Figure 5B:
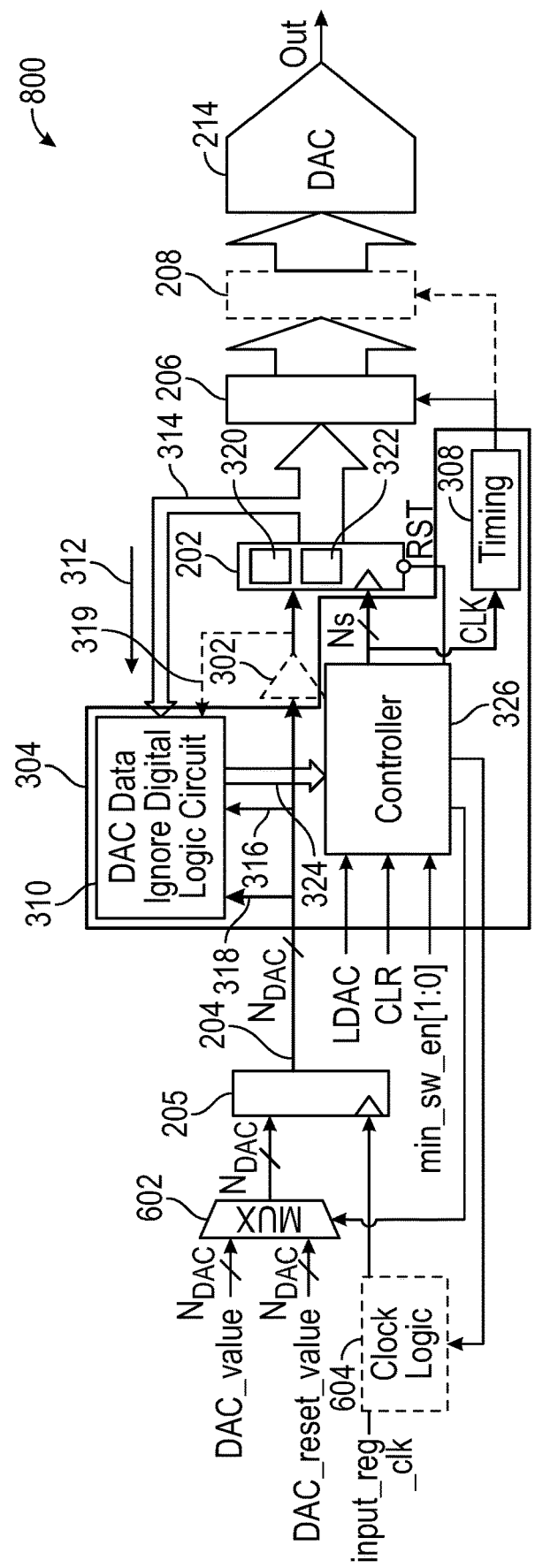
FIG. 5B is another example of a DAC system to convert a digital input signal to an output level of an analog output signal that can implement various techniques of this disclosure.

FIG. 5B is another example of a DAC system 800 to convert a digital input signal to an output level of an analog output signal that can implement various techniques of this disclosure. Many of the components of the DAC system 800 are similar to the components of the DAC system 600 of FIG. 4B, as such, use similar reference numbers. For purposes of conciseness, similar components will not be described in detail again. In addition, the DAC system 800 is configured to implement one or more of a partial DAC data ignore switching mode, a system level DAC data ignore switching mode, and a register level DAC data ignore switching mode, as described above with respect to FIG. 5A.

Figure 6:
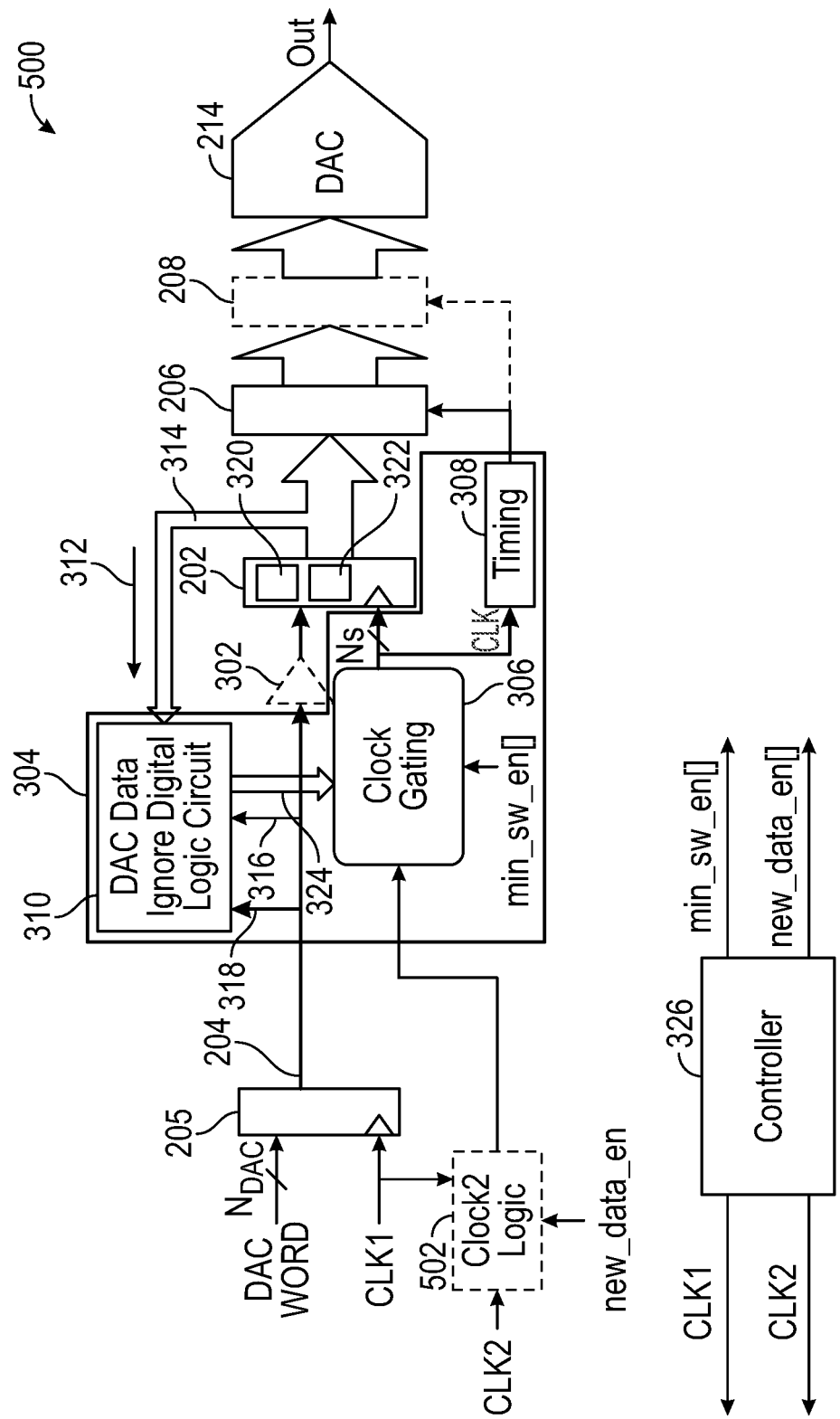
FIG. 6 is another example of a DAC system 500 to convert a digital input signal to an output level of an analog output signal that can implement various techniques of this disclosure.

FIG. 6 is another example of a DAC system 500 to convert a digital input signal to an output level of an analog output signal that can implement various techniques of this disclosure. Many of the components of the DAC system 500 are similar to the components of the DAC system 300 of FIG. 4A and, as such, use similar reference numbers. For purposes of conciseness, similar components will not be described in detail again. In addition, the DAC system 500 is configured to implement one or more of a partial DAC data ignore switching mode, a system level DAC data ignore switching mode, and a register level DAC data ignore switching mode, like the DAC system 300 of FIG. 4A, and the noise-shaped switching mode and the pseudo-random switching modes of FIG. 5.

The DAC system 500 of FIG. 6 provides an option of ignoring DAC register updates, such as a load DAC command, when there is no new data in the input register 205. The controller 326 can generate two clock signals, CLK1 and CLK2. The first clock signal CLK1 can update the input register 205 when new data is available, and the first clock signal CLK1 can also be applied to a clock logic circuit 502 (labelled as "clock2logic"). The first clock signal CLK1 can record/latch/register new data loaded.

The clock logic circuit 502 can also receive a second clock signal CLK2. The second clock signal CLK2 can update the digital DAC register 202 and can be used to reset the logic, DAC register current. The second clock signal CLK2 can be ignored/gated off if the digital DAC register 202 has already been updated with the input register 205 data.

The clock logic circuit 502 can be a latch circuit, for example, or other memory circuit. In a system level DAC data ignore switching mode, the first clock signal CLI can toggle the clock logic circuit 502 to a first state to indicate that new data is present in the input register 205. The second clock signal CLK2 can load the new data from the input register 205 to the digital DAC register 202. Once the new data is loaded into the digital DAC register 202, the clock logic circuit 502 can be reset to a second state to indicate that there is no new data because the data in the digital DAC register 202 matches the data in the input register 205. The digital DAC register 202 only updates, e.g., loads new data, when the clock logic circuit 502 receives a first clock signal CLK1 to toggle the clock logic circuit 502 to a first state, which indicates the presence of new data, regardless of the presence of a second clock signal CLK2. In this manner, the DAC system 500 can detect if the input data has been updated to justify updating the digital DAC register 202.

The controller 326 can generate a new data enable signal ("new_data_en"), which is applied to the clock logic circuit 502 and the clock logic circuit 502 can generate a clock signal to the clock gating circuit 306. The new data enable signal can override the clock logic circuit 502 and force the digital DAC register 202 to update even if there is no new data in the input register 205.

Figure 7:
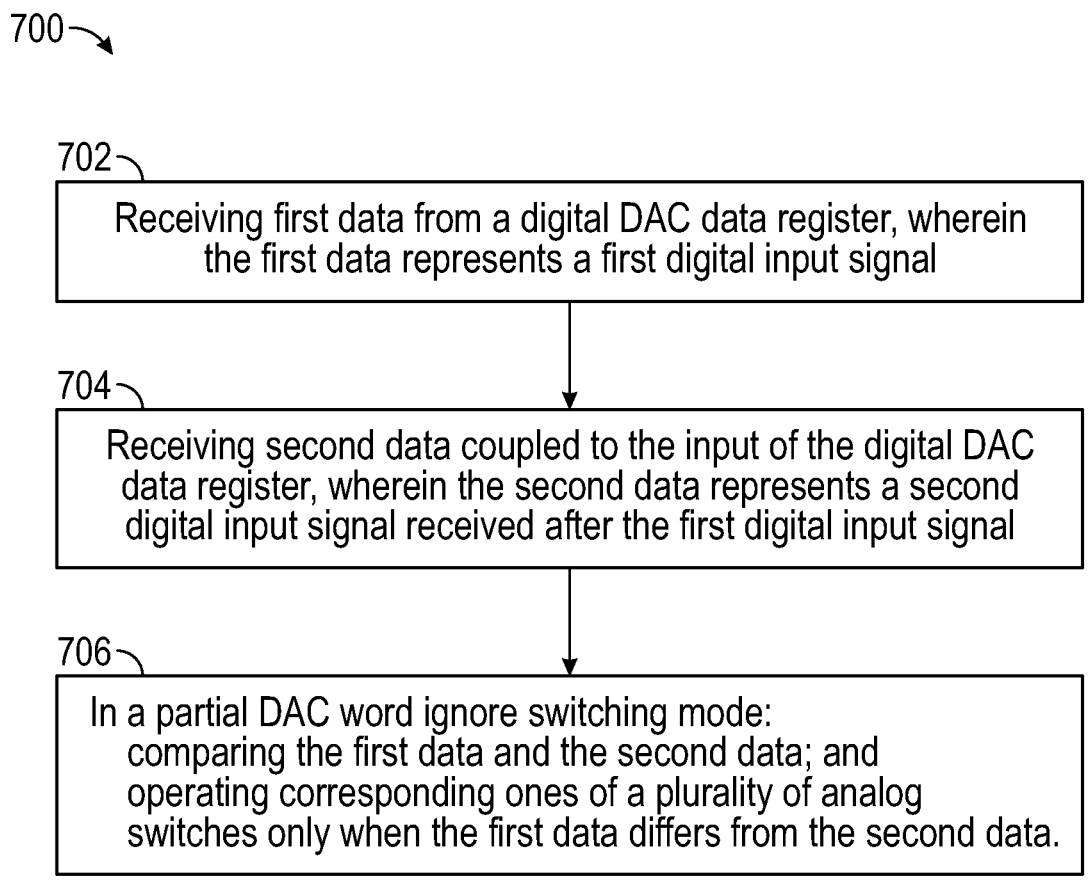
FIG. 7 is a flow diagram of an example of a method of operating a digital-to-analog converter (DAC) system to convert a digital input signal to an output level of an analog voltage output signal.

FIG. 7 is a flow diagram of an example of a method 700 of operating a digital-to-analog converter (DAC) system to convert a digital input signal to an output level of an analog voltage output signal. At block 702, the method 700 includes receiving first data from a digital DAC data register, where the first data represents a first digital input signal. For example, the DAC data ignore digital logic circuit 310 of FIG. 4A can receive first data 312 from a digital DAC register 202, where the first data 312 represents a first digital input signal, such as the digital input signal $D_{IN}$ of FIG. 1.

At block 704, the method 700 includes receiving second data coupled to the input of the digital DAC data register, where the second data represents a second digital input signal received after the first digital input signal. For example, the DAC data ignore digital logic circuit 310 of FIG. 4A can receive second data 316 coupled to the input of the digital DAC register 202, where the second data 316 represents a second digital input signal received after the first digital input signal.

At block 706, in a partial DAC data ignore switching mode, the method 700 includes comparing the first data and the second data and operating corresponding ones of a plurality of analog switches only when DAC decoded states of the first data differs from DAC decoded states of the second data. For example, the DAC data ignore digital logic circuit 310 of FIG. 4A can perform an XOR function on portions of the first data and the second data to determine if there are differences between the decoded states of the first data and the second data. The DAC system 300 can operate corresponding ones of a plurality of analog switches, such as the switches SW 122.0-122.N and the switches SW 132.0-132.M in FIG. 2 if there are differences between the decoded states of the first data and the second data.

The method 700 can optionally include, in the partial DAC data ignore switching mode, performing, using at least some of the plurality of analog switches, code-dependent switching to reduce statically encoded switching when the first data differs from the second data.

The method 700 can optionally include, in a system level DAC data ignore switching mode, receiving the first data from an input register, receiving the second data from the input register, comparing the first data and the second data, and updating a digital DAC register only when there is difference between the first data and the second data.

The method 700 can optionally include, in a system level DAC data ignore switching mode, toggling a latch circuit to a first state, loading the first data into the digital DAC register, resetting the latch circuit to a second state, loading the second data into the digital DAC register only when the latch circuit is toggled to the first state.

The method 700 can optionally include, in a register level DAC data ignore switching mode, ignoring a load DAC request signal when a digital DAC register has not been updated between two consecutive updates.

The method 700 can optionally include performing pseudo-random switching, such as using the pseudo-random switching mode described above.

The method 700 can optionally include performing noise-shaping switching, such as using the noise-shaped switching mode described above. In some examples, in the noise-shaped switching mode, the method includes overriding the partial DAC data ignore switching mode, and operating corresponding ones of the plurality of analog switches so as to perform dynamic element matching.

The method 700 can optionally include, in a normal switching mode, overriding the partial DAC data ignore switching mode, and operating corresponding ones of the plurality of analog switches even when the first data does not differ from the second data.

A pseudo-random number generator may be implemented using a pseudo-random bit sequencer (PRBS). Some implementations use a digital linear feedback shift register (LFSR), known to those of ordinary skill in the art.

FIG. 8 is an example of a switched current DAC, or IDAC, circuit suitable for use with a pseudo-random number generator. A current source 900 is applied to a multiplexer 902 and the digital input data 204 can select a destination for the current from current source 900, such as to IOUT or IOUTB. The DAC can include two PMOS switches 904, 906 that are the current source 900, where the two PMOS switches each represent $2^N-1$ transistors that are being turned ON and OFF on a code-by-code basis. However, $2^N-1$ transistors of fully decoded IDAC designs can become unmanageable as N increases. As such, it can be desirable to segment the data and split the DAC into an MSB block 908 and an LSB block 910, for example, such as using scaling to provide appropriate weighting to the blocks. The specific DAC elements may be selected using a pseudo-random choice within a fully decoded design. Similarly, the digital decode may use a pseudo-random choice of DAC element selection in the DAC sub-blocks separately.

In other examples, switched capacitor circuits may use pseudo-random number generator based device selection rather than a switched, or multiplexed, current source.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Implementation examples described herein use commonly preferred binary DAC block resolution in the multiple DAC stages of a segmented DAC. Binary resolution is a choice, not a constraint, and the DAC switch networks may have non-binary resolution for a binary resolution DAC due to artefacts of a particular DAC architecture design and/or circuit redundancy.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A digital-to-analog converter (DAC) system to convert a digital input signal to an output level of an analog output signal, the DAC system comprising:
   a plurality of analog switches;
   a digital DAC register;
   a DAC circuit coupled to the digital DAC register and configured to generate the analog output signal; and
   a control circuit coupled to the plurality of analog switches and the digital DAC register, wherein the control circuit includes a partial DAC data ignore switching mode, and wherein the control circuit is configured to perform operations including:
      receiving first data from the digital DAC register, wherein the first data represents a first digital input signal; and
      receiving second data coupled to an input of the digital DAC register, wherein the second data represents a second digital input signal received after the first digital input signal;

wherein, in the partial DAC data ignore switching mode, the control circuit is configured to perform operations including:
  comparing the first data and the second data; and
  operating corresponding ones of the plurality of analog switches only when DAC decoded states of the first data differ from DAC decoded states of the second data.

2. The DAC system of claim 1, wherein in the partial DAC data ignore switching mode, the control circuit is configured to perform operations including:
  performing, using at least some of the plurality of analog switches, code-dependent switching to reduce statically encoded switching when the first data differs from the second data.

3. The DAC system of claim 1, wherein the DAC system includes an input register, wherein the control circuit includes a system level DAC data ignore switching mode, and wherein, in the system level DAC data ignore switching mode, the control circuit is configured to perform operations including:
  receiving the first data from the input register;
  receiving the second data from the input register;
  comparing the first data and the second data; and
  updating the digital DAC register only when there is difference between the first data and the second data.

4. The DAC system of claim 1, wherein the DAC system includes an input register coupled to an input of the digital DAC register, wherein the control circuit includes a system level DAC data ignore switching mode, and wherein, in the system level DAC data ignore switching mode, the control circuit is configured to perform operations including:
  receiving the first data from the input register;
  receiving the second data from the input register;
  comparing the first data and the second data; and
  ignoring a request to update the digital DAC register when there is no difference between the first data and the second data.

5. The DAC system of claim 1, wherein the control circuit includes a register level DAC data ignore switching mode, and wherein, in the register level DAC data ignore switching mode, the control circuit is configured to perform operations including:
  ignoring a load DAC request signal when a digital input register has not been updated between two consecutive updates.

6. The DAC system of claim 1, wherein the control circuit includes a pseudo-random switching mode.

7. The DAC system of claim 1, wherein the control circuit includes a noise-shaping switching mode.

8. The DAC system of claim 1, wherein the control circuit includes a normal switching mode, wherein, in the normal switching mode, the control circuit is configured to perform operations including:
  overriding the partial DAC data ignore switching mode; and
  operating corresponding ones of the plurality of analog switches even when the first data does not differ from the second data.

9. The DAC system of claim 1, wherein the control circuit includes a noise-shaped switching mode, wherein, in the noise-shaped switching mode, the control circuit is configured to perform operations including:
  overriding the partial DAC data ignore switching mode; and
  operating individual ones of the plurality of analog switches so as to perform dynamic element matching.

10. A method of operating a digital-to-analog converter (DAC) system to convert a digital input signal to an output level of an analog voltage output signal, the method comprising:
  receiving first data from a digital DAC register, wherein the first data represents a first digital input signal; and
  receiving second data coupled to an input of the digital DAC register, wherein the second data represents a second digital input signal received after the first digital input signal;
  in a partial DAC data ignore switching mode:
    comparing the first data and the second data; and
    operating individual ones of a plurality of analog switches only when DAC decoded states of the first data differs from DAC decoded states of the second data.

11. The method of claim 10, wherein in the partial DAC data ignore switching mode, the method further comprises:
  performing, using at least some of the plurality of analog switches, code-dependent switching to reduce statically encoded switching when the first data differs from the second data.

12. The method of claim 10, wherein, in a system level DAC data ignore switching mode, the method comprises:
  receiving the first data from an input register;
  receiving the second data from the input register;
  comparing the first data and the second data; and
  updating a digital DAC register only when there is difference between the first data and the second data.

13. The method of claim 10, wherein, in a system level DAC data ignore switching mode, the method comprises:
  toggling a latch circuit to a first state;
  loading the first data into the digital DAC register;
  resetting the latch circuit to a second state; and
  loading the second data into the digital DAC register only when the latch circuit is toggled to the first state.

14. The method of claim 10, wherein, in a register level DAC data ignore switching mode, the method comprises:
  ignoring a load DAC request signal when a digital DAC register has not been updated between two consecutive updates.

15. The method of claim 10, comprising:
  performing pseudo-random switching of a plurality of analog switches.

16. The method of claim 10, wherein, in a normal switching mode, the method comprises:
  overriding the partial DAC data ignore switching mode; and
  operating individual ones of the plurality of analog switches even when the first data does not differ from the second data.

17. The method of claim 10, comprising:
  performing noise-shaped switching.

18. The method of claim 17, wherein, performing noise-shaped switching comprises:
  overriding the partial DAC data ignore switching mode; and
  operating corresponding ones of the plurality of analog switches so as to perform dynamic element matching.

19. A digital-to-analog converter (DAC) system to convert a digital input signal to an output level of an analog output signal, the DAC system comprising:
  a plurality of analog switches;
  a digital DAC register;
  a DAC circuit coupled to the digital DAC register and configured to generate the analog output signal; and a control circuit coupled to the plurality of analog switches and the digital DAC register, wherein the control circuit includes a partial DAC data ignore switching mode and a normal switching mode, and wherein the control circuit is configured to perform operations including:
  receiving first data from the digital DAC register, wherein the first data represents a first digital input signal; and
  receiving second data coupled to an input of the digital DAC register, wherein the second data represents a second digital input signal received after the first digital input signal;
  wherein, in the partial DAC data ignore switching mode, the control circuit is configured to perform operations including:
  comparing the first data and the second data; and
  operating individual ones of the plurality of analog switches only when DAC decoded states of the first data differ from DAC decoded states of the second data; and wherein, in the normal switching mode, the control circuit is configured to perform operations including:
  overriding the partial DAC data ignore switching mode; and
  operating individual ones of the plurality of analog switches even when the first data does not differ from the second data.

20. The DAC system of claim 19, wherein the control circuit includes a system level DAC data ignore switching mode, and wherein, in the system level DAC data ignore switching mode, the control circuit is configured to perform operations including:
  toggling a latch circuit to a first state;
  loading the first data into the digital DAC register;
  resetting the latch circuit to a second state; and
  loading the second data into the digital DAC register only when the latch circuit is toggled to the first state.

* * * * *